United States Patent [19]

Masuoka et al.

[11] Patent Number: 4,779,014
[45] Date of Patent: Oct. 18, 1988

[54] BICMOS LOGIC CIRCUIT WITH ADDITIONAL DRIVE TO THE PULL-DOWN BIPOLAR OUTPUT TRANSISTOR

[75] Inventors: Fujio Masuoka; Kiyofumi Ochii, both of Yokohama, Japan

[73] Assignee: Kabushiki Kaisha Toshiba, Japan

[21] Appl. No.: 95,263

[22] Filed: Sep. 11, 1987

[30] Foreign Application Priority Data

Sep. 26, 1986 [JP] Japan .................. 61-227254

[51] Int. Cl.⁴ .............................. H03K 17/04
[52] U.S. Cl. ........................ 307/446; 307/443; 307/451; 307/548; 307/270; 307/570
[58] Field of Search ........... 307/443, 446, 448, 451, 307/546-548, 550, 554, 246, 570, 270

[56] References Cited

U.S. PATENT DOCUMENTS

| 3,699,355 | 10/1972 | Madrazo et al. ............ 307/570 |
| 4,661,723 | 4/1987 | Masuda et al. ............ 307/451 X |
| 4,678,943 | 7/1987 | Uragami et al. ............ 307/443 X |
| 4,687,954 | 8/1987 | Yasuda et al. ............ 307/451 X |
| 4,716,310 | 12/1987 | Tanizawa et al. ............ 307/443 X |
| 4,733,110 | 3/1988 | Hara et al. ............ 307/443 X |

FOREIGN PATENT DOCUMENTS

| 0099100 | 1/1984 | European Pat. Off. . |
| 0132822 | 2/1985 | European Pat. Off. . |
| 0145004 | 6/1985 | European Pat. Off. . |
| 0189564 | 8/1986 | European Pat. Off. . |
| 0025423 | 2/1984 | Japan .................. 307/446 |
| 0020426 | 1/1986 | Japan .................. 307/446 |

Primary Examiner—Stanley D. Miller
Assistant Examiner—D. R. Hudspeth
Attorney, Agent, or Firm—Finnegan, Henderson Farabow, Garrett and Dunner

[57] ABSTRACT

A logic circuit comprises at least one signal input terminal, an output terminal, an output circuit including a first bipolar transistor coupled between the output terminal and a reference potential terminal, to discharge the output terminal, and an MOS type logic circuit for supplying to the base of the first bipolar transistor a signal of a level corresponding to an input signal supplied to the at least one signal input terminal. The logic circuit further comprises a control MOS transistor coupled between a power source terminal and the base of the bipolar transistor, for supplying part of the base current to the bipolar transistor in response to a signal at the output terminal.

18 Claims, 8 Drawing Sheets

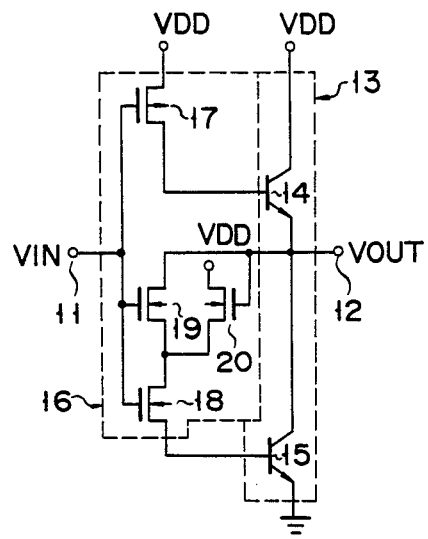
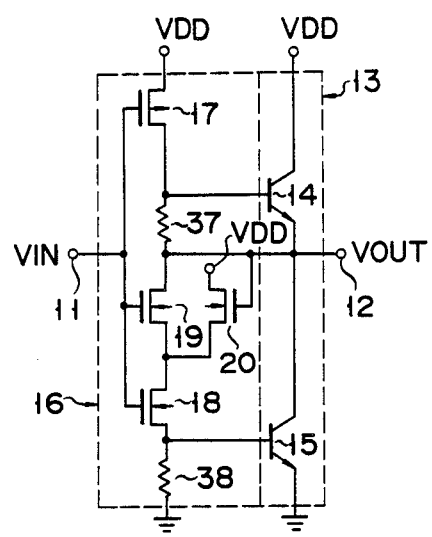
F I G. 10   F I G. 11
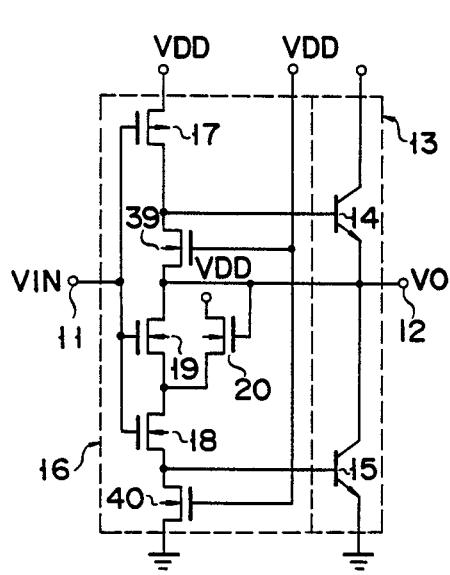
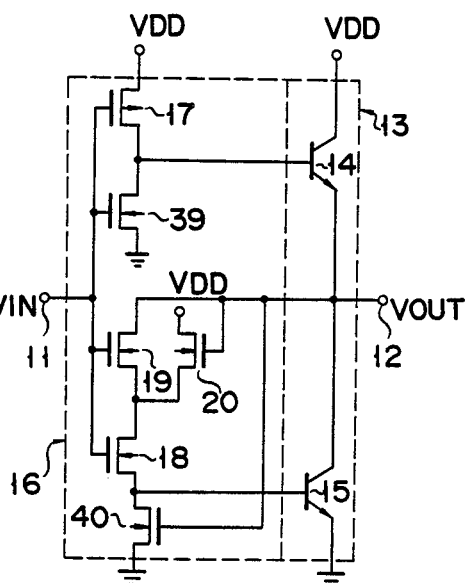
F I G. 12   F I G. 13

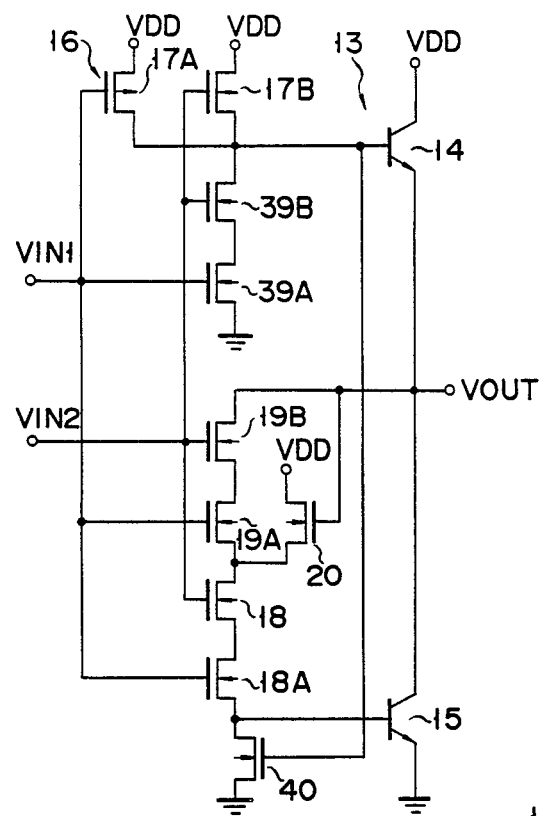
F I G. 17
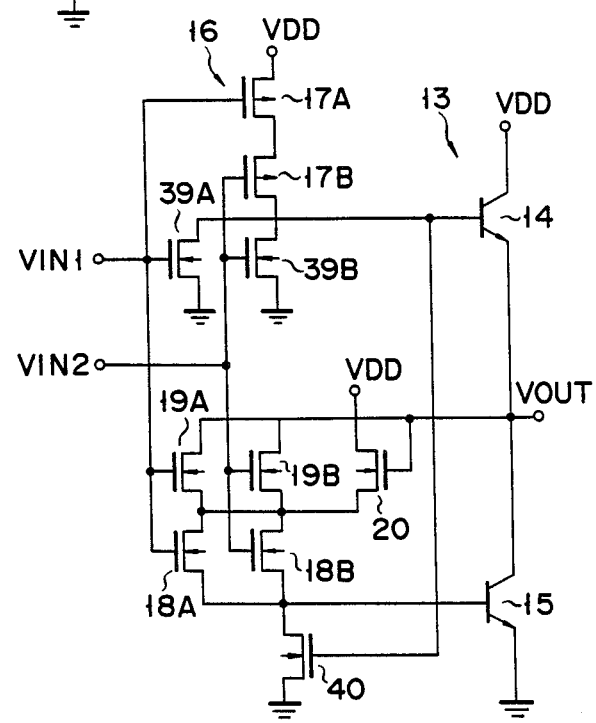
F I G. 18

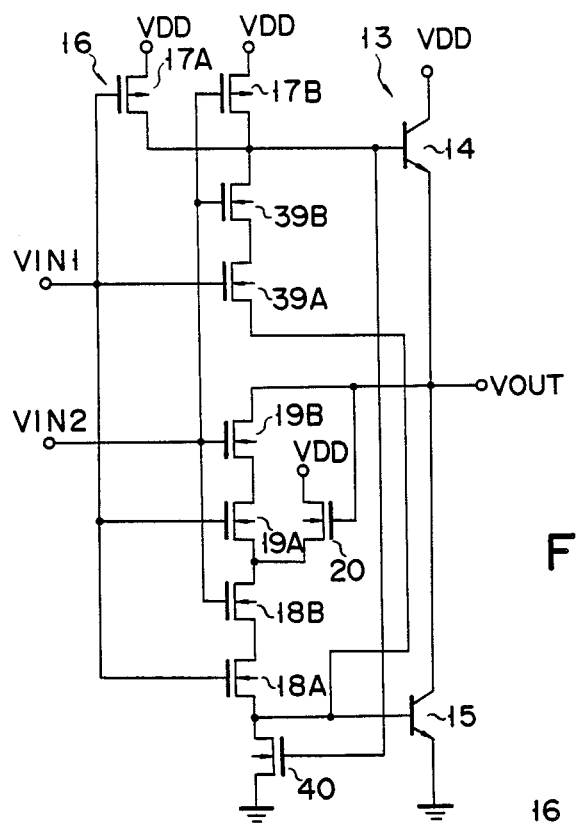
F I G. 19
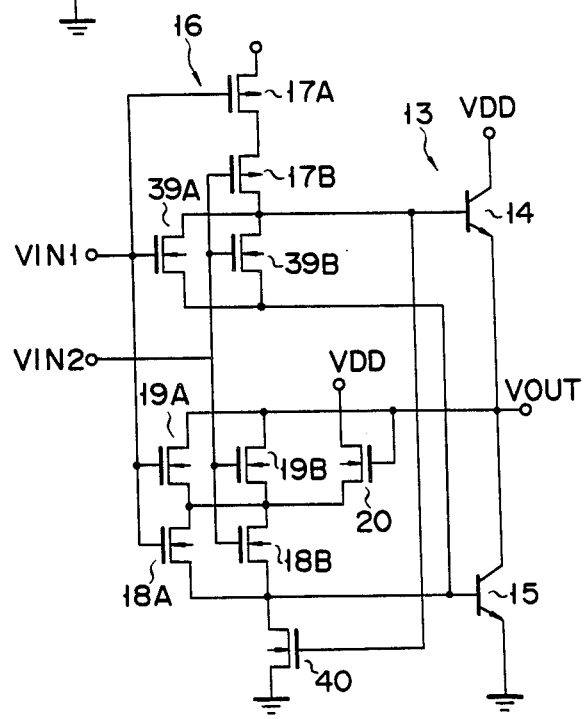
F I G. 20

BICMOS LOGIC CIRCUIT WITH ADDITIONAL DRIVE TO THE PULL-DOWN BIPOLAR OUTPUT TRANSISTOR

BACKGROUND OF THE INVENTION

This invention relates to a logic circuit with a bipolar transistor output stage.

The characteristic feature of a CMOS logic circuit made up of P channel and N channel MOS transistors is its low current consumption. However, it involves the problem that it is difficult to increase the current drive ability for a load circuit without increasing the chip size when the circuit is integrated. For this reason, a so-called Bi/MOS logic circuit has recently been proposed. In this logic circuit, most of the circuit is made of MOS transistors, and bipolar transistors are used only for the output stage that directly drives the load circuit.

FIG. 1 shows a circuit diagram illustrating a configuration of the prior art inverter, which is a basic circuit of such a Bi/MOS logic circuit. In this circuit, P channel MOS transistor 32 and N channel MOS transistor 33 execute a logic operation in response to the signal Vin at input terminal 31. Output terminal 36 is charged and discharged with a large current by using NPN bipolar transistors 34 and 35, thereby to set output signal Vout. When input signal Vin is at an "L" or low level, P channel MOS transistor 32 is turned on, and the base current is supplied to bipolar transistor 34, from power source terminal $V_{DD}$. Transistor 34 is then turned on. The output terminal is charged to an "H" or high level with a large current via transistor 34. When input signal Vin becomes high, N channel MOS transistor 33 is turned on. Then, the base current is supplied to transistor 35 via MOS transistor 33 from output terminal 36 which has been charged to a high level. With this, transistor 35 is turned on. Output terminal 36 is discharged with a large current to the low level via transistor 35.

As described above, in the FIG. 1 circuit, the output terminal is charged and discharged with a large current, thus increasing the load drive ability. In addition, as compared with the MOS transistor, the bipolar transistor allows the flow of a large current with even a small element area. This can make the chip size small when the circuit is integrated.

However, the prior art of FIG. 1 involves the problem that the current consumption is increased, since bipolar transistors 34 and 35 are provided in the output stage, and new through-current occurs between the power source terminal and ground, when these bipolar transistors are turned on and off.

FIG. 2 is an equivalent circuit diagram of the FIG. 1 circuit, in which the stray capacitances are considered. In the figure, capacitance $C_{PD}$ represents the stray capacitance associated with the drain of P channel MOS transistor 32. Capacitors $C_{ND}$ and $C_{NS}$ respectively represent the stray capacitances of the drain and source of N channel MOS transistor 33. Capacitors $C_{CB}$ and $C_{BE}$ respectively represent the capacitances between the base and collector and between the base and emitter of each of transistors 34 and 35. Capacitor $S_{SUB}$ represents the capacitance between output terminal 36 and the semiconductor substrate used when this circuit is integrated. Capacitor $C_L$ represents the load capacitance between output terminal 36 and ground. Currents $I_{PD}$ and $I_{ND}$ respectively flow through the drain of P channel MOS transistor 32 and the drain of N channel MOS transistor 33.

In this equivalent circuit, signal transistor delay time t ($P_{DH}$) caused when output signal Vout rises from low to high in level is given as:

$$t(P_{DH}) = \frac{V_{BE}(C_{CB} + C_{CE} + C_{PD})}{I_{PD}} + \frac{V_{OH}(C_{CB} + C_{PD})}{I_{PD}} + \frac{V_{OH}(C_L + C_{SUB} + C_{ND} + \beta \cdot C_{CB})}{\beta \cdot I_{PD}} \quad (1)$$

where $V_{OH}$ is the potential of the high level, and $\beta$ is the current-amplification factor of the bipolar transistor. The initial term of the right side of the equation represents the time required for charging transistor 34 up to the base potential of $V_{BE}$. The second term represents the time required for charging transistor 34 from $V_{BE}$ to ($V_{BE}+V_{OH}$) to the base potential. The third term represents the time required for charging output terminal 36 to the potential of $V_{OH}$.

Simplifying the equation (1) using constants, we have $$t(P_{DH}) = t_1 + \frac{1}{B} \cdot \frac{V_{OH}}{I_{PD}} \cdot C_L \quad (2)$$

The signal transfer delay time t (PDL) required for output signal Vout to drop from high to low in level is given as:

$$t(P_{DL}) = \frac{V_{BE}(C_{CB} + C_{BE} + C_{NS})}{I_{ND}} + \frac{(V_{OH} - C_{CB}) \cdot C_{CB}}{I_{ND}} + \frac{V_{OH}(C_L + C_{SUB} + C_{ND} + \beta(C_{CB} + C_{PD}))}{\beta \cdot I_{ND}} \quad (3)$$

The initial term of the right side of the equation (3) represents the time required for charging transistor 35 up to the base potential of $V_{BE}$. The second term represents the time required for charging transistor 35 from $V_{BE}$ to ($V_{BE}+V_{OH}$) to the base potential. The third term represents the time required for discharging output terminal 36 to the ground potential.

Simplifying the equation (3) using constants, we have $$t(P_{DL}) = t_1' + \frac{1}{B} \cdot \frac{V_{OH}}{I_{ND}} \cdot C_L \quad (4)$$

As seen from equations (2) and (4), the delay time due to load capacitance $C_L$ when output terminal 36 is charged and discharged, is reduced by $1/\beta$ compared to that of the prior CMOS inverter.

FIG. 3 is a graph showing the relation between the load capacitance and the delay time for both the ordinary CMOS converter and the Bi/MOS inverter. Characteristic curve A represents the characteristic of the Bi/MOS inverter. Characteristic curve B represents the characteristic of the ordinary CMOS inverter. As seen from the graph, if load capacitance $C_L$ is about 0.5 pF or more, the Bi/MOS inverter has a shorter delay time than the ordinary CMOS inverter.

The term $\beta \cdot C_{CB}$ of the equation (1) and the term $\beta(C_{CB}+C_{PD})$ of the equation (3) each represent the leak current component due to the Miller effect of the bipolar transistor. In the FIG. 1 logic circuit, the leak current component is consumed as through-current during the switching. For example, when output terminal 36 is high, if transistor 35 is turned on, and output terminal 36 is discharged to the low level, there is no discharge path for the electrons previously charged in stray capacitances $C_{BE}$ and $C_{PD}$. For this reason, after the discharge of output terminal 36 to the low level is started, the emitter potential of transistor 36 decreases. Base current flows in transistor 34, after the voltage between the base and emitter reaches a value large enough to cause transistor 34 to turn on. Current $\beta$-times as large as the base current flows in transistor 34 as collector current. Accordingly, when output signal Vout decreases from high to low, transistors 34 and 35 are both turned on, and through-current flows between power source terminal $V_{DD}$ and ground. Similarly when output signal Vout changes from low to high, transistors 34 and 35 are both turned on. With this, through-current flows between the power source terminal $V_{DD}$ and ground.

As described above, although the FIG. 1 inverter can realize the reduction of the delay time, it presents the new problem that through-current flows during the switching of transistors 34 and 35, thus increasing the current consumption. Therefore, the FIG. 1 circuit has a problem from the standpoint of practical use.

To cope with this, there have been proposed various types of improved logic circuits. FIGS. 4 through 9 show circuit diagrams of these conventional improved Bi/MOS inverters. The improvement of these inverters lies in that bypass current paths are provided for the bases of transistors 34 and 35 to prevent current leakage in bipolar transistors 34 and 35, so that the electrons charged in stray capacitances $C_{BE}$ and $C_{PD}$ can be discharged. In the FIG. 4 circuit, these bypass current paths are realized by resistors 37 and 38. In the FIG. 5 circuit, the paths are realized by two channel MOS transistors whose gates are connected commonly to power source terminal $V_{DD}$. In the FIG. 6 circuit, the gate of transistor 39 in FIG. 9 is connected to input terminal 31, and the gate of transistor 40 is connected to output terminal 36, so that both transistors 39 and 40 may perform the switching only when necessary. In the FIG. 7 circuit, the gate of transistor 40 in FIG. 6 is connected to the base of transistor 34, so that transistor 40 is switched at the potential of the base node of transistor 34. In the FIG. 8 circuit, the bypass current path provided by transistor 39 is coupled with the base of transistor 35. In the FIG. 9 circuit, in addition to N channel MOS transistors 39 and 40 of the FIG. 8 circuit, N channel MOS transistor 41 is provided, whose gates, drain and source are respectively connected to input terminal 31, power source terminal $V_{DD}$, and the base of transistor 35. In this circuit, since the base current for transistor 35 is also supplied from power source terminal $V_{DD}$, the discharging speed of output terminal 36, when transistor 34 is turned on, can be increased.

However, in each of the FIGS. 4 to 8 circuits, the base and collector of transistor 35 are interconnected via the on-state N channel MOS transistor 33, when output signal Vout is discharged from high to low. For this reason, the base current for transistor 35 decreases when output terminal 36 is discharged and the signal Vout becomes close to the low level. This restricts the discharge of output terminal 36, to deform the waveshape of signal Vout when it falls. In the case of the FIG. 9 circuit, it is free from any waveform deformation problems, because the base current for transistor 35 can be supplied also from power source terminal $V_{DD}$. However, transistor 35 is operated in the saturation region, since the current is continuously supplied via transistor 41 even after output voltage Vout is charged to the low level. Therefore, the reverse emitter current flows to output terminal 36 via a base-collector path, increasing the potential of output voltage Vout to above the ground potential. Therefore, the FIG. 9 circuit also has a problem when it is practically used.

As described above, in the prior art logic circuit including the bipolar transistors in the output stage, current consumption is increased by the provision of the bipolar transistors. The circuit with preventive measures against the increase of current consumption involves the problem that the output waveform, especially the fall of the waveform, is deformed. The circuits with the other measures have a problem in that although they do not experience the output waveform problem, the output terminal floats electrically.

SUMMARY OF THE INVENTION

Accordingly, an object of this invention is to provide a logic circuit which is free from the output waveform problem and the electrical floating problem of the output terminal as well.

To achieve the above object, there is provided a logic circuit comprising at least one signal input terminal, an output terminal, an output circuit including a first bipolar transistor coupled between the output terminal and a reference potential terminal to discharge the output terminal, an MOS logic circuit for supplying to the base of the first bipolar transistor a signal of a level corresponding to an input signal supplied to at least one signal input terminal, and a control MOS transistor coupled between a power source terminal and the base of the bipolar transistor, and for supplying part of base current to the bipolar transistor in response to the signal at the output terminal.

According to this invention, when the output terminal is discharged via a bipolar transistor, base current is supplied to the bipolar transistor by an MOS transistor whose gate is supplied with the signal at the output terminal. Therefore, the output terminal never floats, electrically.

BRIEF DESCRIPTION OF THE DRAWINGS

FIG. 10 shows a circuit diagram of a first embodiment of a logic circuit according to this invention;

FIG. 11 shows a logic circuit which uses resistors for prevention of the current leakage occurring in the logic circuit of FIG. 10;

FIG. 12 shows a logic circuit which uses MOS transistors instead of resistors in FIG. 11;

FIGS. 13 to 15 show modifications to the logic circuit of FIG. 12;

FIGS. 17 and 18 show modifications of the logic circuit of FIG. 14; and

FIGS. 19 and 20 show modifications of the logic circuit of FIG. 15.

DETAILED DESCRIPTION OF THE PREFERRED EMBODIMENTS

Figure 1:
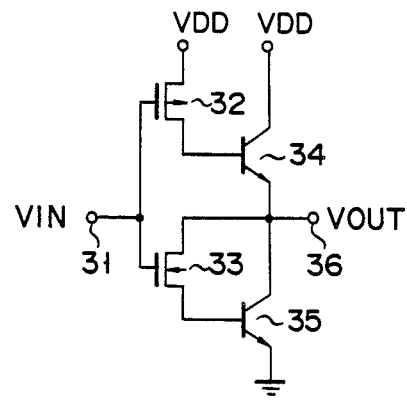
FIG. 1 is a basic circuit diagram of a prior Bi/MOS logic circuit.
Figure 2:
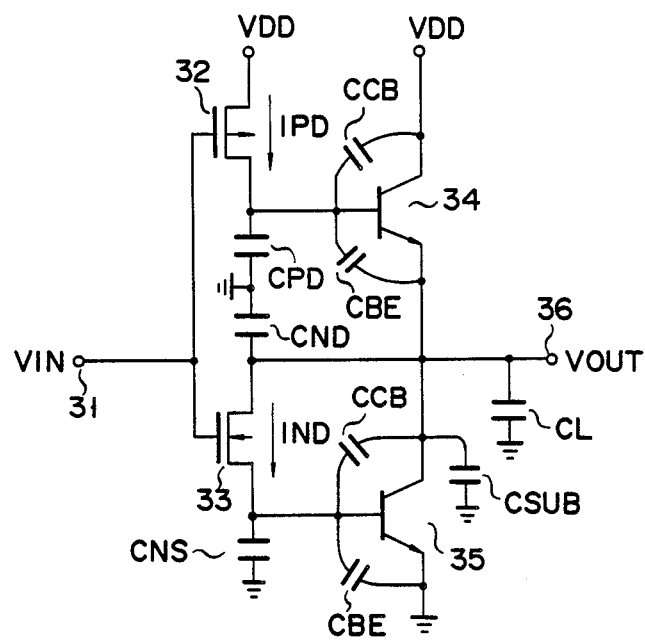
FIG. 2 shows an equivalent circuit diagram of the FIG. 1 logic circuit, in which the stray capacitances are considered.
Figure 3:
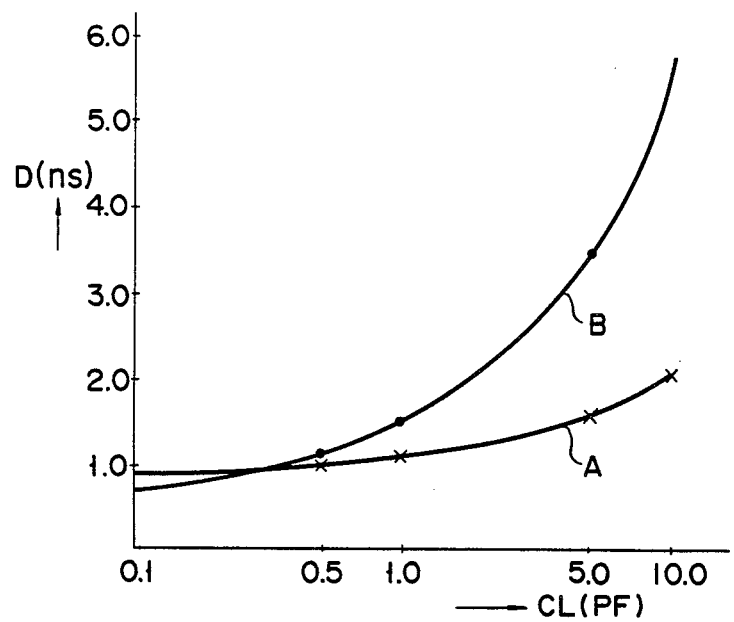
FIG. 3 is a graph showing the relations between the load capacitance and the delay time for both the ordinary CMOS inverter and the Bi/MOS inverter.

FIG. 10 shows a circuit diagram of a first embodiment of a logic circuit according to this invention, when it is applied to an inverter. In the figure, input signal Vin is supplied to input terminal 11. Signal Vout is taken out from output terminal 12. Output section 13 includes NPN bipolar transistors 14 and 15. Logic section 16 includes P channel MOS transistor 17 and N channel MOS transistor 18, and generates signals to be respectively supplied to the bases of transistors 14 and 15, on the basis of input signal Vin.

The collector of transistor 14 in output section 13 is connected to power source terminal $V_{DD}$, and the emitter is connected to output terminal 12. The collector of the other transistor 15 is connected to output terminal 12, and the emitter is grounded.

The source of P channel MOS transistor 17 in logic section 16 is connected to power source terminal $V_{DD}$. The drain is connected to the base of transistor 14. The gate is connected to input terminal 11. The source of N channel MOS transistor 18 in logic section 16 is grounded. The gate is connected to input terminal 11.

In this embodiment, two N channel MOS transistors 19 and 20 are also provided. The drain of transistor 19 is connected to output terminal 12. The source is connected to the drain of transistor 18 in logic section 16. The gate is connected to input terminal 11. The drain of transistor 20 is connected to power source terminal $V_{DD}$. The source is connected to the drain of transistor 18. The gate is connected to output terminal 12.

An operation of the circuit thus constructed is as follows.

First, assume that when output signal Vout is at an "H" or high level, input signal Vin becomes high. With this, transistors 18 and 19 are both turned on. Base current is supplied to transistor 15 in output section 13 by the high level signal Vout at output terminal 12. Transistor 15 is then turned on, and the discharge of output terminal 12 is started. Immediately after the discharge, transistor 20 is also turned on, because signal Vout at output terminal 12 is at a voltage higher than the threshold voltage of an N channel MOS transistor. Therefore, transistor 18 in output section 16 is turned on, and when output terminal 12 is discharged, the base current is supplied to transistor 15 from power source terminal $V_{DD}$ via transistor 20. As a result, the fall of the waveform can be made steep, since the discharge of output terminal 12 is done rapidly.

When signal Vout comes close to the ground potential, and to a potential lower than the threshold value of an N channel MOS transistor, transistor 20 is turned off. With the turning-off, supply of the base current for transistor 15 from power source terminal $V_{DD}$ is stopped. In this case, the base current is supplied to transistor 15 only via transistors 18 and 19. Signal Vout, which is already lowered to near the ground potential, further approaches the ground potential.

On the other hand, when output signal Vout is at an "L" or low level, if input signal Vin becomes low, transistor 17 in logic section 16 is turned on. Base current is supplied to transistor 14 in output section 13 via transistor 17, and transistor 14 is turned on. The charge for output signal Vout is performed by power source terminal $V_{DD}$ via transistor 14. Under this condition, transistor 20 would be turned on if output signal Vout was larger than the threshold voltage. However, since transistor 18 in logic section 16 is kept turned off by input signal Vin, output terminal 12 will never be charged. Nor will wasteful current flow through transistor 20.

As described above, in the embodiment of the logic circuit, the deformation of the output waveform, especially the falling portion of the waveform, can be prevented, which is the problem of the prior art. Also, there never occurs a case that output terminal 12 electrically floats.

Figure 4:
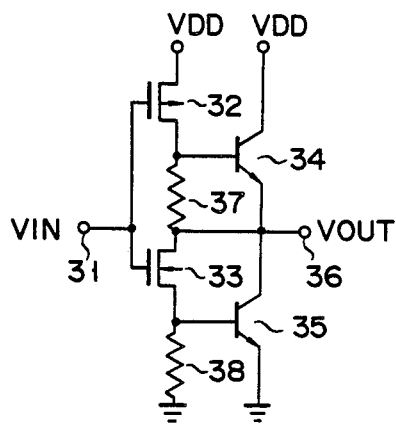
FIG. 4 shows a logic circuit which uses resistors for preventing current leakage in the logic circuit of FIG. 1.

FIG. 11 shows a circuit diagram of a second embodiment of a logic circuit according to this invention when it is applied to an inverter. In the first embodiment of FIG. 10, through-current flows when transistors 14 and 15 perform switching operations. The second embodiment prevents the generation of the through-current. The embodiment is based on the FIG. 10 circuit, and additionally includes resistors 37 and 38, like the FIG. 4 circuit. Resistor 37, inserted between the base of transistor 14 and output terminal 12, is used to inhibit transistor 14 from turning on when output terminal 12 is discharged by transistor 15. That is, resistor 37 functions to provide a discharge path through which charges stored at the base node of transistor 14 may be discharged to output terminal 12. Resistor 38 inserted between the base of transistor 15 and ground is used to inhibit transistor 15 from turning on when output terminal 12 is charged by transistor 14. That is, resistor 38 provides a discharge path, permitting charges stored at the base node of transistor 15 to be discharged.

Thus, the above-mentioned embodiment can not only prevent the deformation of the output waveform, but also prevent the generation of through-current when the transistor is switched.

Figure 5:
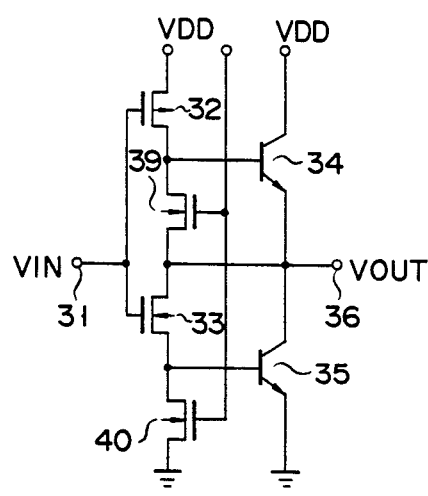
FIG. 5 shows a logic circuit which uses MOS transistors instead of resistors in FIG. 4.

FIG. 12 shows a circuit configuration of a third embodiment of this invention. This embodiment successfully solves the above two problems, like the second embodiment of FIG. 11. The embodiment is based on the FIG. 10 circuit. Instead of resistors 37 and 38 in the FIG. 11 embodiment, N channel MOS transistors 39 and 40 are additionally provided, whose gates are connected commonly to power source terminal $V_{DD}$, like in FIG. 5.

Figure 6:
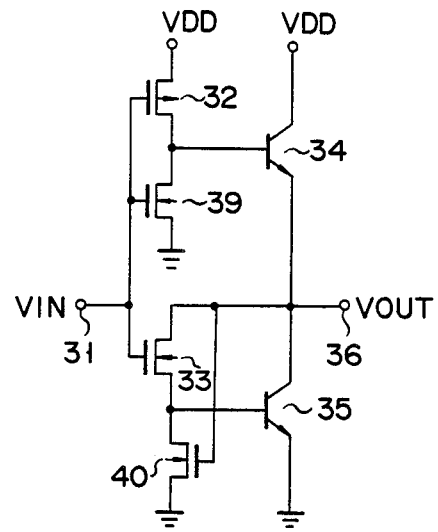
FIGS. 6 to 9 show modifications of the logic circuit of FIG. 5.

FIG. 13 shows a circuit configuration of a fourth embodiment of this invention. This embodiment successfully solves the above two problems, like the second embodiment of FIG. 11. The embodiment is based on the FIG. 10 circuit. Instead of resistors 37 and 38 in the FIG. 11 embodiment, N channel MOS transistors 39 and 40 are additionally provided, whose gates are connected commonly to power source terminal $V_{DD}$, like in FIG. 6.

Figure 7:
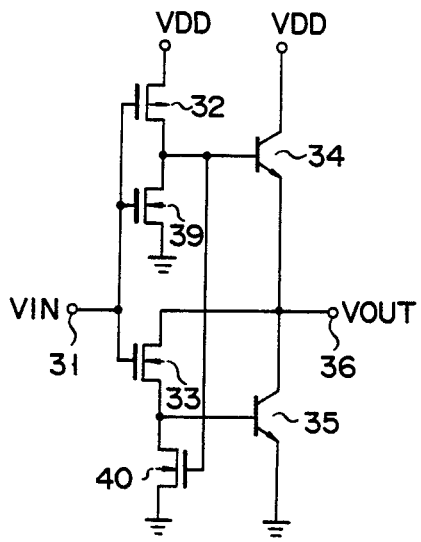
Figure 14:
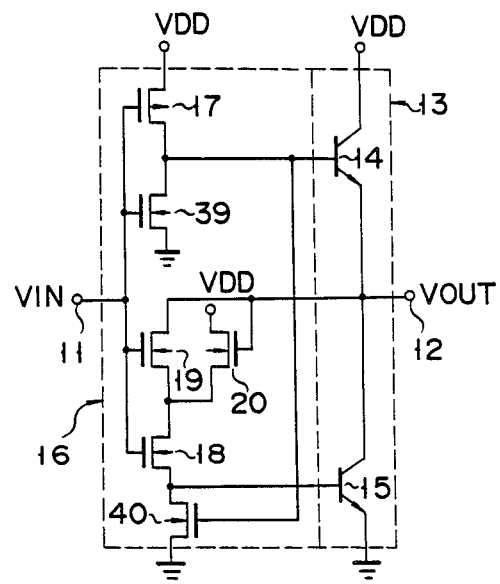

FIG. 14 shows a circuit configuration of a fifth embodiment of this invention. This embodiment successfully solves the above two problems, like the second embodiment of FIG. 11. The embodiment is based on the FIG. 10 circuit. Instead of resistors 37 and 38 in the FIG. 11 embodiment, N channel MOS transistors 39 and 40 are additionally provided, whose gates are connected commonly to power source terminal $V_{DD}$, like in FIG. 7.

Figure 8:
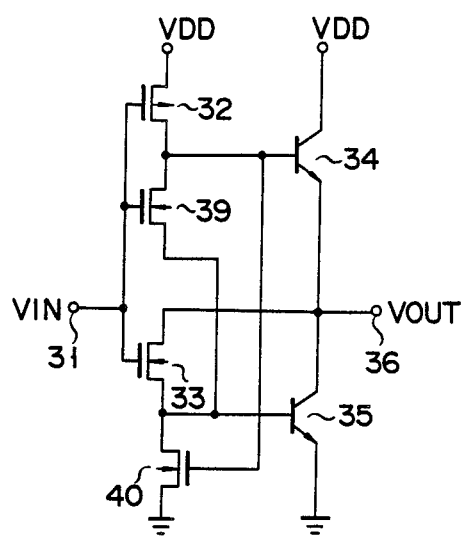
Figure 9:
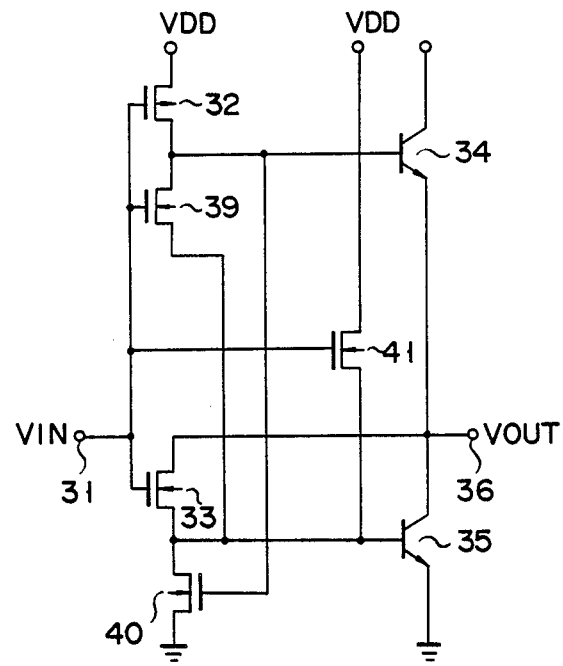
Figure 15:
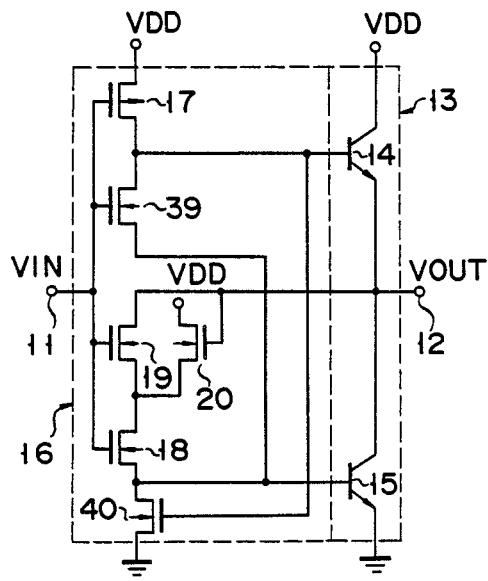

FIG. 15 shows a circuit configuration of a sixth embodiment of this invention. This embodiment successfully solves the above two problems, like the second embodiment of FIG. 11. The embodiment is based on the FIG. 10 circuit. N channel MOS transistors 39 and 40 are additionally provided, like in FIG. 8.

Figure 16:
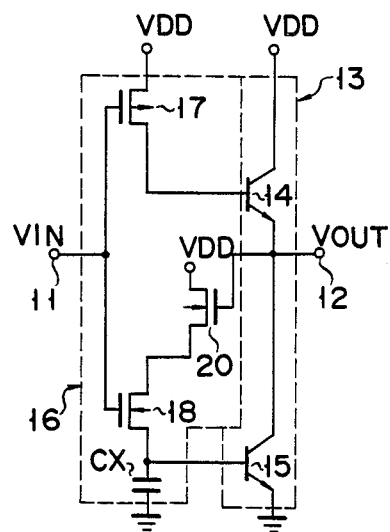
FIG. 16 shows a modification of the logic circuit of FIG. 10.

FIG. 16 shows a circuit configuration of a seventh embodiment of this invention. The seventh embodiment is similar to the FIG. 10 circuit, except that transistor 19 is omitted. In the circuit, when transistor 15 is turned on, and signal Vout comes close to the ground potential and becomes below the threshold voltage of the N channel MOS transistor, causing transistor 20 to be turned off, then the supply of the base current to transistor 15 is completely stopped. However, it suffices with such a circuit design that even without transistor 19, transistor 15 is kept turned on till the discharge of output terminal 12 terminates. For example, this is realized by coupling the base of transistor 15 having capacitor CX of sufficiently large capacitance as compared with the load capacitance. In this case, capacitor CX may be omitted, if the stray capacitance of the base of transistor 15 is sufficiently large.

It should be understood that this invention is not limited to the above-mentioned embodiments, but can be variously changed and modified within the scope of this invention. While in each of the above-mentioned embodiments, this invention has been applied to an inverter, which is the basic circuit element of a logic circuit, it is evident that this invention is applicable to the AND, OR, NAND, and NOR circuits, which have two or more input terminals, and also to various types of logic circuits having other special logic operations. To apply this invention to such various types of logic circuits, it is only necessary to suitably construct logic section 16.

FIG. 17 shows a circuit diagram of a NAND circuit, which is made by modifying the logic circuit of FIG. 14. MOS transistor 17 is replaced by P channel MOS transistors 17A and 17B which are connected in parallel. MOS transistors 18, 19 and 39 are respectively replaced by N channel MOS transistors 18A and 18B, 19A and 19B, and 39A and 39B. The gates of MOS transistors 17A, 18A, 19A and 39A are coupled with input terminal Vin1, while the gates of MOS transistors 17B, 18B, 19B and 39B are coupled with input terminal Vin2.

The NAND circuit executes a logic operation on the basis of input signals Vin1 and Vin2. This circuit also prevents output terminal Vout from floating electrically, and current leakage from flowing through bipolar transistors 14 and 15.

FIG. 18 shows a NOR circuit obtained by modifying the logic circuit of FIG. 14. MOS transistor 17 is replaced by P channel MOS transistors 17A and 17B which are connected in series. MOS transistors 18, 19 and 39 are respectively replaced by N channel MOS transistors 18A and 18B, 19A and 19B, and 39A and 39B. Each pair of transistors are connected in parallel with each other. The NOR circuit executes the NOR function on the basis of input signals Vin1 and Vin2, and has the same effect as the FIG. 14 circuit.

FIGS. 12 and 20 respectively show NAND and NOR circuits obtained by modifying the logic circuit of FIG. 15. In this case also, the same effects as those of the FIG. 15 circuit can be obtained.

What is claimed is:

1. A logic circuit comprising:
   at least one signal input terminal;
   an output terminal;
   output circuit means including a first bipolar transistor coupled between the output terminal and a reference potential terminal, to discharge said output terminal;
   MOS logic circuit means for supplying to the base of said first bipolar transistor a signal of a level corresponding to an input signal supplied to said at least one signal input terminal; and
   a control MOS transistor coupled between a power source terminal and the base of said bipolar transistor, and for supplying part of base current to the bipolar transistor in response to the signal at said output terminal.

2. The logic circuit according to claim 1, wherein said output circuit means further includes a second bipolar transistor coupled between said power source terminal and the output terminal, said logic circuit means includes a first MOS transistor of one channel type coupled between said power source terminal and the base of the second bipolar transistor, and a second MOS transistor of an opposite channel type coupled between said control MOS transistor and the first bipolar transistor.

3. The logic circuit according to claim 2, wherein said logic circuit means further includes a capacitor coupled between said second MOS transistor and the reference potential terminal.

4. The logic circuit according to claim 2, wherein said logic circuit means further includes a third MOS transistor coupled between said output terminal and the second MOS transistor, and whose conductivity is controlled by a signal at said signal input terminal.

5. The logic circuit according to claim 4, wherein said logic circuit means includes first and second resistor means which are respectively coupled between the bases and emitters of said first and second bipolar transistors.

6. The logic circuit according to claim 4, wherein said logic circuit means further includes fourth and fifth MOS transistors respectively coupled between the bases and emitters of said first and second bipolar transistors, and whose gates are coupled with said power source terminal.

7. The logic circuit according to claim 4, wherein said logic circuit means further includes a fourth MOS transistor coupled between the base and emitter of the first bipolar transistor, and whose gate is coupled with the output terminal, and a fifth MOS transistor coupled between the base of the second bipolar transistor and the reference potential terminal, and whose gate is coupled with the signal input terminal.

8. The logic circuit according to claim 4, wherein said logic circuit means further includes a fourth MOS transistor coupled between the base and emitter of the first bipolar transistor, and whose gate is coupled with the first MOS transistor, and a fifth MOS transistor coupled between the base of the second bipolar transistor and the reference potential terminal, and whose gate is coupled with the signal input terminal.

9. The logic circuit according to claim 4, wherein said logic circuit means further includes a fourth MOS transistor coupled between the base and emitter of the first bipolar transistor, and whose gate is coupled with the first MOS transistor, and a fifth MOS transistor coupled between the base of the second bipolar transistor and the second MOS transistor, and whose gate is coupled with the signal input terminal.

10. The logic circuit according to claim 1, wherein a plurality of said signal input terminals are provided, said output circuit means further includes a second bipolar transistor coupled between the power source terminal and output terminal, and said logic circuit means supplies to the bases of said first and second bipolar transistors signals of levels corresponding to signals at said plurality of signal input terminals.

11. The logic circuit according to claim 10, wherein said logic circuit means includes first MOS transistors of one channel type coupled in parallel between the power source terminal and the base of second bipolar transistor, and whose gates are respectively coupled with the plurality of signal input terminals, second MOS transistors of an opposite channel type coupled in series between the base of the first bipolar transistor and said control MOS transistor and whose gates are respectively coupled with the plurality of said input terminals, third MOS transistors of the opposite channel type coupled in series between the output terminal and control MOS transistor, and whose gates are respectively coupled with the plurality of said input terminals.

12. The logic circuit according to claim 10, wherein said logic circuit means includes first MOS transistors of one channel type coupled in series between the power source terminal and the base of second bipolar transistor, and whose gates are respectively coupled with the plurality of signal input terminals, second MOS transistors of an opposite channel type coupled in series between the base of the first bipolar transistor and control MOS transistor and whose gates are respectively coupled with the plurality of said input terminals, third MOS transistors of the opposite channel type coupled in parallel between the output terminal and control MOS transistor, and whose gates are respectively coupled with the plurality of said input terminals.

13. The logic circuit according to claim 11, wherein said logic circuit means further includes an MOS transistor of the opposite channel type coupled between the base of the first bipolar transistor and the reference potential terminal, and whose gate is coupled with the base of the second bipolar transistor.

14. The logic circuit according to claim 11, wherein said logic circuit means further includes MOS transistors of the opposite type coupled in series between the base of the second bipolar transistor and the reference potential terminal, and whose gates are respectively coupled with the plurality of signal input terminals.

15. The logic circuit according to claim 11, wherein said logic circuit means further includes MOS transistors of the opposite type coupled in series between the base of the first and second bipolar transistors, and whose gates are respectively coupled with the plurality of signal input terminals.

16. The logic circuit according to claim 12, wherein said logic circuit means further includes MOS transistors of the opposite type coupled in parallel between the base of the second bipolar transistor and the reference potential terminal, and whose gates are respectively coupled with the plurality of signal input terminals.

17. The logic circuit according to claim 12, wherein said logic circuit means further includes an MOS transistor of the opposite channel type coupled in parallel between the bases of the first and second bipolar transistors, and whose gates are respectively coupled with the plurality of signal input terminals.

18. The logic circuit according to claim 12, wherein said logic circuit means further includes an MOS transistor of the opposite channel type coupled between the base of the first bipolar transistor and the reference potential terminal, and whose gate is coupled with the base of the second bipolar transistor.

* * * * *